(12) United States Patent
Gardner et al.

(10) Patent No.: US 9,013,861 B2
(45) Date of Patent: Apr. 21, 2015

(54) CHARGE STORAGE DEVICE, METHOD OF MAKING SAME, METHOD OF MAKING AN ELECTRICALLY CONDUCTIVE STRUCTURE FOR SAME, MOBILE ELECTRONIC DEVICE USING SAME, AND MICROELECTRONIC DEVICE CONTAINING SAME

(75) Inventors: Donald S. Gardner, Mountain View, CA (US); Eric C. Hannah, Pebble Beach, CA (US); Rong Chen, Sunnyvale, CA (US); John L. Gustafson, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 213 days.

(21) Appl. No.: 13/637,795

(22) PCT Filed: Apr. 2, 2010

(86) PCT No.: PCT/US2010/029821
§ 371 (c)(1),
(2), (4) Date: Sep. 27, 2012

(87) PCT Pub. No.: WO2011/123135
PCT Pub. Date: Oct. 6, 2011

(65) Prior Publication Data
US 2013/0016452 A1 Jan. 17, 2013

(51) Int. Cl.
*H01G 9/00* (2006.01)
*H01G 9/048* (2006.01)
(Continued)

(52) U.S. Cl.
CPC .............. *H01G 9/048* (2013.01); *H01G 11/36* (2013.01); *H01G 11/86* (2013.01); *H01G 11/26* (2013.01); *Y02E 60/13* (2013.01)

(58) Field of Classification Search
CPC ..... H01G 9/155; H01G 9/0425; H01G 11/26; H01G 9/052; H01G 9/058; H01G 11/24
USPC ................... 361/502, 503, 508, 516
See application file for complete search history.

(56) References Cited

U.S. PATENT DOCUMENTS

| 4,882,649 A | 11/1989 | Chen et al. |
| 6,833,983 B2 | 12/2004 | Nguyen et al. |

(Continued)

FOREIGN PATENT DOCUMENTS

| JP | S54-41455 A | 4/1979 |
| JP | S58-032769 A | 2/1983 |

(Continued)

OTHER PUBLICATIONS

Office Action Received for Japanese Patent Application No. 2013-502551 mailed on Aug. 6, 2013, 3 pages of Office Action and 4 pages of English Translation.

(Continued)

*Primary Examiner* — Dion R Ferguson
(74) *Attorney, Agent, or Firm* — Kenneth A. Nelson

(57) ABSTRACT

In one embodiment a charge storage device includes first (110) and second (120) electrically conductive structures separated from each other by a separator (130). At least one of the first and second electrically conductive structures includes a porous structure containing multiple channels (111, 121). Each one of the channels has an opening (112, 122) to a surface (115, 125) of the porous structure. In another embodiment the charge storage device includes multiple nanostructures (610) and an electrolyte (650) in physical contact with at least some of the nanostructures. A material (615) having a dielectric constant of at least 3.9 may be located between the electrolyte and the nanostructures.

21 Claims, 5 Drawing Sheets

(51) Int. Cl.
*H01G 11/36* (2013.01)
*H01G 11/86* (2013.01)
*H01G 11/26* (2013.01)

(56) References Cited

U.S. PATENT DOCUMENTS

| | | | |
|---|---|---|---|
| 7,050,291 | B2 | 5/2006 | Narendra et al. |
| 7,324,328 | B2 | 1/2008 | Narendra et al. |
| 7,393,604 | B2 | 7/2008 | Rocke et al. |
| 7,486,497 | B2 | 2/2009 | Kobayashi et al. |
| 7,541,782 | B2 | 6/2009 | Narendra et al. |
| 2003/0086238 | A1 | 5/2003 | Bendale et al. |
| 2003/0165741 | A1 | 9/2003 | Maly-Schreiber et al. |
| 2004/0070921 | A1 | 4/2004 | Ikeda et al. |
| 2005/0262675 | A1 | 12/2005 | Sun |
| 2007/0022590 | A1* | 2/2007 | Hirano et al. ........ 29/25.03 |
| 2008/0014504 | A1 | 1/2008 | Schneuwly |
| 2008/0266754 | A1* | 10/2008 | Kazaryan et al. ........ 361/508 |
| 2008/0304207 | A1* | 12/2008 | Brandon et al. ........ 361/502 |
| 2010/0008021 | A1 | 1/2010 | Hu et al. |
| 2011/0075324 | A1 | 3/2011 | Singh |

FOREIGN PATENT DOCUMENTS

| | | |
|---|---|---|
| JP | 1-246812 A | 10/1989 |
| JP | 2003286017 A | 10/2003 |
| JP | 2005-050689 A | 2/2005 |
| JP | 2005-136401 A | 5/2005 |
| JP | 2005-142381 A | 6/2005 |
| JP | 2006-004814 A | 1/2006 |
| JP | 2006-179431 A | 7/2006 |
| KR | 10-2007-0069281 A | 7/2007 |
| KR | 10-2008-0018702 A | 2/2008 |
| WO | 95/26833 A1 | 10/1995 |
| WO | 2005/022568 A1 | 3/2005 |
| WO | 2006/027767 A1 | 3/2006 |
| WO | 2007/061143 A1 | 5/2007 |
| WO | 2009/148977 A1 | 12/2009 |
| WO | 2011/123135 A1 | 10/2011 |

OTHER PUBLICATIONS

Desplobain et al., "Investigations on Porous Silicon as Electrode Material in Electrochemical Capacitors", physica status solidi, vol. 4, Issue 6, May 2007, pp. 2180-2184.

Teixidor et al., "Fabrication and Characterization of Three Dimensional Carbon Electrodes for Lithium-Ion Batteries", Journal of Power Sources, vol. 183, Issue 2, 2008, pp. 730-740.

Bakhoum, "New Mega-Farad Ultracapacitors", IEEE Transactions on Ultrasonics, Ferroelectrics, and Frequency Control, vol. 56, Issue 1, Jan. 2009, pp. 14-21.

Boarino et al., "Electrical Properties of Meso-Porous Silicon: from a Surface Effect to Coulomb Blockade and More", Journal of the Electrochemical Society, vol. 156, Issue 12, 2009, 8 pages.

Rojas et al., "Mesoporous Germanium Formation by Electrochemical Etching", Journal of the Electrochemical Society, vol. 156, Issue 8, 2009, pp. D310-D313.

Tiginyanu et al., "Section 6.1 Porous Germanium", Chapter 6, Porous III-V Semiconductors, Retrieved on Feb. 11, 2010, Webpage available at: http://www.porous-35.com/other-porous-semiconductors-2.html.

International Search Report and Written Opinion received for PCT Patent Application No. PCT/US2011/054372, mailed on May 2, 2012, 10 pages.

International Search Report and Written Opinion received for PCT Patent Application No. PCT/US2010/029821, mailed on Dec. 31, 2010, 9 pages.

PCT Patent Application No. PCT/US2011/059211, filed on Nov. 3, 2011, 34 pages.

PCT Patent Application No. PCT/US2011/064013, filed on Dec. 8, 2011, 37 pages.

PCT Patent Application No. PCT/US2011/067434, filed on Dec. 27, 2011, 31 pages.

PCT Patent Application No. PCT/US2011/066650, filed on Dec. 21, 2011, 34 pages.

PCT Patent Application No. PCT/US2011/064969, filed on Dec. 14, 2011, 35 pages.

PCT Patent Application No. PCT/US2012/031719, filed on Mar. 30, 2012, 38 pages.

PCT Patent Application No. PCT/US2011/068046, filed on Dec. 30, 2011, 18 pages.

PCT Patent Application No. PCT/US2011/067485, filed on Dec. 28, 2011, 21 pages.

PCT Patent Application No. PCT/US2012/025973, filed on Feb. 21, 2012, 29 pages.

PCT Patent Application No. PCT/US2011/054372, filed on Sep. 30, 2011, 33 pages.

Office Action Received for Russian Patent Application No. 2012141588 mailed on Feb. 7, 2014, 4 pages of Office Action and 2 pages of English Translation.

Office Action Received for Korean Patent Application No. 10-2012-7025729 maiied on Dec. 10, 2013, 3 pages of Office Action and 2 pages of English Translation.

International Preliminary Report on Patentability received for PCT Patent Application No. PCT/US2010/029821, mailed on Oct. 11, 2012, 7 pages.

Office Action Received for Japanese Patent Application No. 2013-502551 mailed on Jul. 1, 2014, 3 pages of Office Action and 3 pages of English Translation.

Office Action Received for Canada Patent Application No. 2,794,714 mailed on May 12, 2014, 2 pages of Office Action.

Office Action Received for Korean Patent Application No. 10-2012-7025729 maiied on Jul. 24, 2014, 4 pages of Office Action and 3 pages of English Translation.

Office Action Received for Russian Patent Application No. 2012141588 mailed on Oct. 31, 2014, 4 pages of Office Action and 3 pages of English Translation.

Office Action Received for Taiwanese Patent Application No. 100111594, mailed on Dec. 5, 2014, 12 Pages of Taiwanese Office Action and 1 Page of English Translation.

* cited by examiner

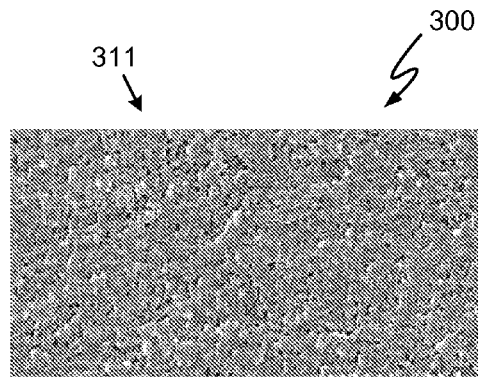
FIG. 3
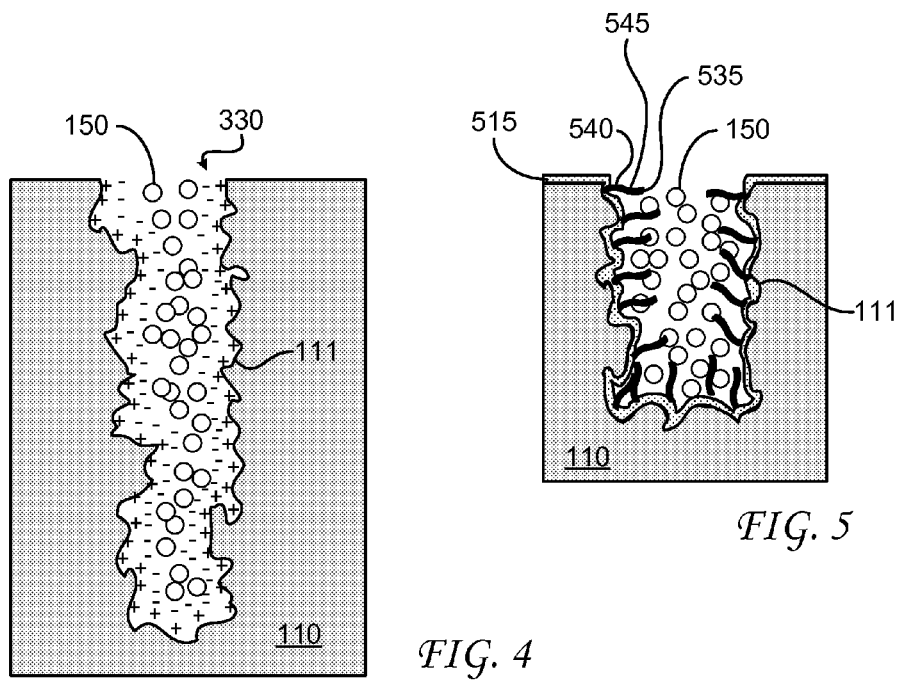
FIG. 4
FIG. 5

CHARGE STORAGE DEVICE, METHOD OF MAKING SAME, METHOD OF MAKING AN ELECTRICALLY CONDUCTIVE STRUCTURE FOR SAME, MOBILE ELECTRONIC DEVICE USING SAME, AND MICROELECTRONIC DEVICE CONTAINING SAME

FIELD OF THE INVENTION

The disclosed embodiments of the invention relate generally to charge storage devices, and relate more particularly to capacitors, including electric double-layer capacitors.

BACKGROUND OF THE INVENTION

Charge storage devices, including batteries and capacitors, are used extensively in electronic devices. In particular, capacitors are widely used for applications ranging from electrical circuitry and power delivery to voltage regulation and battery replacement. As capacitor technology has continued to develop, several types have emerged. For example, electric double-layer capacitors (EDLCs), also referred to as ultracapacitors (among other names), are characterized by high energy storage and power density, small size, and low weight and have thus become promising candidates for use in several applications.

BRIEF DESCRIPTION OF THE DRAWINGS

The disclosed embodiments will be better understood from a reading of the following detailed description, taken in conjunction with the accompanying figures in the drawings in which:

FIG. 3 is a cross-sectional scanning electron microscope image of a piece of porous silicon according to an embodiment of the invention;

FIG. 4 is a cross-sectional representation of an electric double layer within a channel of a charge storage device according to an embodiment of the invention;

FIG. 5 is a cross-sectional view of a channel within a charge storage device showing various layers and structures according to embodiments of the invention;

Figure 1:
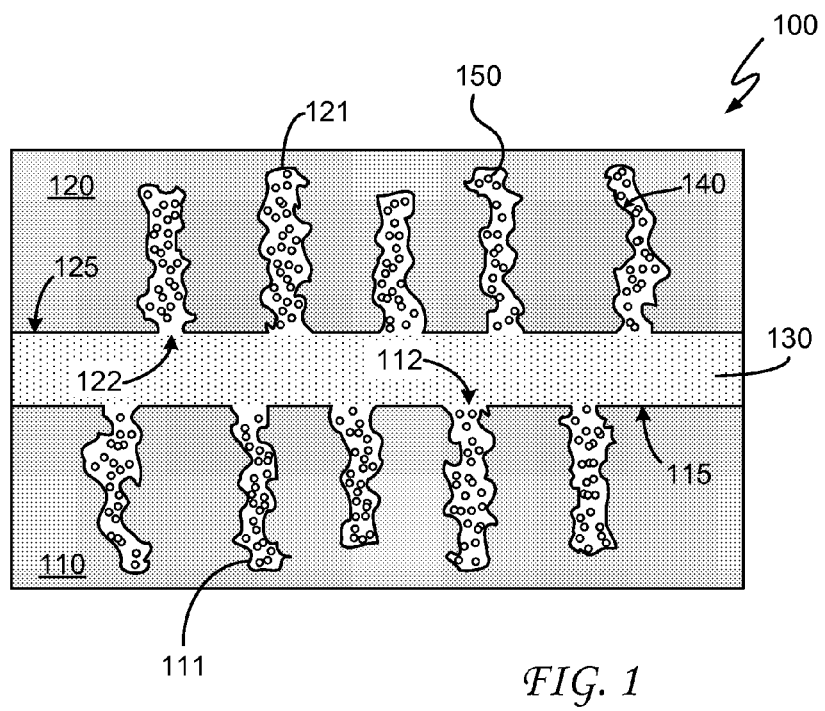
FIGS. 1 and 2 are cross-sectional views of a charge storage device according to embodiments of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a charge storage device comprises a first electrically conductive structure and a second electrically conductive structure separated from each other by an electrical insulator, wherein at least one of the first electrically conductive structure and the second electrically conductive structure comprises a porous structure containing multiple channels, and wherein each one of the channels has an opening to a surface of the porous structure.

Ultracapacitors and similar high-surface-area charge storage devices can be used in microelectronics to store energy, for electrical bypassing in electric circuits, as part of circuitry for power delivery, as a memory storage element, and for a host of other functions. An advantage of ultracapacitors over batteries is that ultracapacitors can be charged and discharged quickly because they do not rely on chemical reactions to store energy, and they don't degrade significantly over their lifetime—even when charged and discharged rapidly. Ultracapacitors are also less sensitive to temperature than are batteries.

The development path of ultracapacitors is such that they appear likely to eventually achieve greater energy density (both in terms of energy per kilogram (kg) and of energy per liter) than batteries. Ultracapacitors can thus be used in conjunction with batteries in order to protect the batteries from high power bursts (thereby extending the battery lifetime). Furthermore, the electrodes in batteries can be made thinner if the ultracapacitors can provide the high power demands. Alternatively, ultracapacitors may make sense as a battery replacement. Embodiments of the invention are capable of increasing the energy density of ultracapacitors by several orders of magnitude, for example by increasing the electrode surface area with nanomaterials coated with high-k dielectric materials, as will be discussed in detail below.

Figure 2:
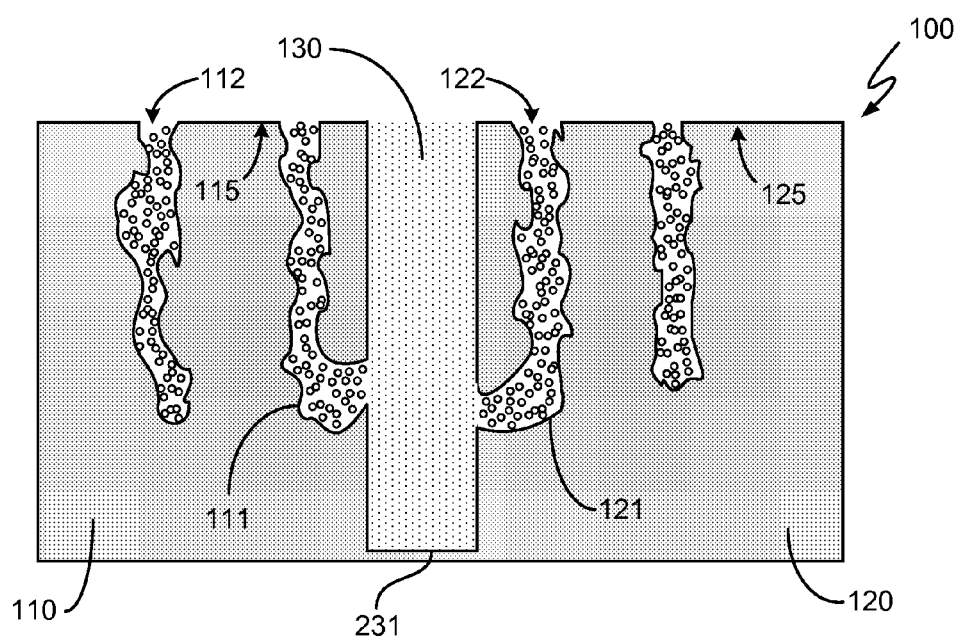

Referring now to the drawings, FIGS. 1 and 2 are cross-sectional views of a charge storage device 100 according to embodiments of the invention. As illustrated in FIGS. 1 and 2, charge storage device 100 comprises an electrically conductive structure 110 and an electrically conductive structure 120 separated from each other by an electrical insulator. This electrical insulator could take one of various forms, as discussed in more detail below. At least one of electrically conductive structures 110 and 120 comprises a porous structure containing multiple channels, each one of which has an opening to a surface of the porous structure. In the illustrated embodiments both electrically conductive structure 110 and electrically conductive structure 120 comprise such a porous structure. Accordingly, electrically conductive structure 110 comprises channels 111 with openings 112 to a surface 115 of the corresponding porous structure and electrically conductive structure 120 comprises channels 121 with openings 122 to a surface 125 of the corresponding porous structure. In an embodiment where only one of electrically conductive structures 110 and 120 comprises a porous structure with multiple channels, the other electrically conductive structure can be, for example, a metal electrode or a polysilicon structure.

Various configurations of charge storage device 100 are possible. In the embodiment of FIG. 1, for example, charge storage device 100 comprises two distinct porous structures (electrically conductive structure 110 and electrically conductive structure 120) that have been bonded together face-to-face with an intervening separator 130. As another example, in the embodiment of FIG. 2 charge storage device 100 comprises a single planar porous structure in which a first section (electrically conductive structure 110) is separated from a second section (electrically conductive structure 120) by a trench 231 containing separator 130. One of the electrically conductive structures will be the positive side and the other electrically conductive structure will be the negative side. Separator 130 permits the transfer of ions but does not allow the transfer of fluid such as would be found in an electrolyte.

FIG. 2 shows a small bridge of material connecting electrically conductive structure 110 and electrically conductive structure 120. If left unaddressed, this bridge may act as an electrical short between the two electrically conductive structures. There are several possible solutions, however. For example, the bridge may be removed using a polishing operation. Alternatively, the electrically conductive structures may be formed in a heavily-doped top layer or region of a wafer while the trench extends down to an underlying lightly-doped substrate that is not a very good conductor. Or a silicon-on-insulator structure may be used.

As an example, the porous structure of electrically conductive structures 110 and 120 can be created by a wet etch process in which a liquid etchant applied to a surface of the electrically conductive structures etches away portions of the electrically conductive structure in a way that it at least somewhat similar to the way water is able to carve channels in rock. This is why each one of the channels has an opening to the surface of the electrically conductive structure; the wet etch method is incapable of creating fully-enclosed cavities, i.e., cavities with no opening to the surface, like an air bubble trapped inside a rock, within the porous structure. This is not to say that those openings cannot be covered with other materials or otherwise closed up because of the presence of or addition of other materials—that is in fact likely to occur in several embodiments—but, whether covered or not, the described openings to the surface are a feature of each channel in each porous structure according to at least one embodiment of the invention. (One embodiment in which the openings may be covered up is one in which a layer of epitaxial silicon as a location for circuitry or other wiring is grown on top of the channels). Porous structures according to embodiments of the invention can be fabricated with very precise and uniform pore size control (in contrast to active carbon). This allows fast charging (pore size may be optimized in order to be compatible with the size of the ions) and also improves the capacitance (no area will be malfunctioning). This would also allow narrow distribution of voltage fluctuation.

It should be noted in connection with this discussion that porous carbon, being formed in a manner different from that described above, has a different structure—one that is characterized by fully-enclosed cavities having no surface openings. As a result, porous carbon is not suitable—or at least not as desirable—for at least certain embodiments of the invention (although it should be mentioned here that certain other embodiments (such as, for example, the thick electrically conductive structure described below) may contain fully-enclosed cavities). It should also be noted that the FIG. 1 and FIG. 2 depictions of the porous structures are highly idealized in that, to mention just one example, all of channels 111 and 121 are shown as only extending vertically. In reality the channels would branch off in multiple directions to create a tangled, disorderly pattern that may look something like the porous structure shown in FIG. 3.

FIG. 3 is a cross-sectional scanning electron microscope (SEM) image showing a piece of porous silicon 300 according to an embodiment of the invention. As illustrated, porous silicon 300 contains multiple channels 311, some of which appear elongated vertically and some of which appear as roughly circular holes. The latter group represent channels for which the visible portion is oriented horizontally. It should be understood that channels 311 are likely to twist and turn along their lengths such that a single channel may have both vertical and horizontal portions as well as portions that are neither completely vertical nor completely horizontal but fall somewhere in between.

With the right etchant, it should be possible to make porous structures having the described characteristics from almost any conductive material. As an example, a porous silicon structure may be created by etching a silicon substrate with a mixture of hydrofluoric acid and ethanol. More generally, porous silicon and other porous structures may be formed by such processes as anodization and stain etching.

Besides porous silicon, which has already been mentioned, some other materials that may be especially well-suited for charge storage devices according to embodiments of the invention are porous germanium and porous tin. Possible advantages of using porous silicon include its compatibility with existing silicon technology. Porous germanium enjoys a similar advantage as a result of existing technology for that material and, as compared to silicon, enjoys the further possible advantage that its native oxide (germanium oxide) is water-soluble and so is easily removed. (The native oxide that forms on the surface of silicon may trap charge—which is an undesirable result—especially where the silicon porosity is greater than about 20 percent.) Porous germanium is also highly compatible with silicon technology. Possible advantages of using porous tin, which is a zero-band-gap material, include its enhanced conductivity with respect to certain other conductive and semiconductive materials. Other materials may also be used for the porous structure, including silicon carbide, alloys such as an alloy of silicon and germanium, and metals such as copper, aluminum, nickel, calcium, tungsten, molybdenum, and manganese. A silicon-germanium alloy, for example, will advantageously exhibit a much smaller volume difference than a pure germanium structure.

Embodiments of the invention may make use of very narrow channels. In certain embodiments (to be described in detail below), an electrolyte is introduced into the channels. Molecules in the electrolyte may be on the order of 2 nanometers (nm). In at least one embodiment, therefore, a smallest dimension of each one of the channels is no less than 2 nm so as to permit the electrolyte to flow freely along the entire length of the channels.

In the same or another embodiment the smallest dimension of each one of the channels is no greater than 1 micrometer ($\mu$m). This upper size limit for the smallest dimension of the channels may be chosen for particular embodiments in order to maximize the surface area of the porous structures of those embodiments. Smaller (e.g., narrower) channels lead to increased overall surface area for each electrically conductive structure because a larger number of such narrower channels can fit into an electrically conductive structure of a given size. Because capacitance is proportional to surface area, channels constrained in size in the manner described would likely, and advantageously, result in capacitors with increased capacitance. (The channels' other dimensions, e.g., their lengths, may also be manipulated in order to increase surface area (or to achieve some other result)—i.e., longer channels may be preferred over shorter ones—but otherwise are likely to be less critical than the smallest dimension discussed above.) In other embodiments the smallest dimension of the channels may be larger than 1 $\mu$m—perhaps as large as 10 $\mu$m or more. Although they would decrease the surface area, such larger channels may provide more interior space in which to grow or otherwise form additional structures, if desired. At least one such embodiment is discussed below.

Charge storage device 100 further comprises an electrically conductive coating 140 on at least a portion of the porous structure and in at least some of channels 111 and/or channels 121. Such an electrically conductive coating may be necessary in order to maintain or enhance the conductivity of the porous structure—especially where the porosity of the porous structure exceeds about 20 percent. As an example, electrically conductive coating 140 may be a silicide. As another example, electrically conductive coating 140 may be a coating of metal such as, for example, aluminum, copper, and tungsten, or other electrical conductors such as tungsten nitride, titanium nitride, and tantalum nitride. Each of the listed materials has the advantage of being used in existing CMOS technology. Other metals such as nickel and calcium may also be used as electrically conductive coating 140. These materials may be applied using processes such as electroplating, chemical vapor deposition (CVD), and/or atomic layer deposition (ALD). It should be noted here that a CVD process of tungsten is self-limiting, meaning that the tungsten will form a couple of monolayers and then stop growing. The resulting thin electrically conductive coating is exactly what is needed for embodiments of charge storage device 100 because it never gets so thick as to seal off the channels and prevent the CVD gas from penetrating deeper into the channels. If desired, the porous structure can also be doped with a dopant designed to increase the electrical conductivity of the structure (boron, arsenic, or phosphorus, for example, for porous silicon; arsenic or gallium, for example, for porous germanium).

In one embodiment the electrical insulator separating electrically conductive structure 110 from electrically conductive structure 120 comprises a dielectric material. For example, one could make a very high-capacitance capacitor using a porous silicon electrode oxidized with silicon dioxide ($SiO_2$) along with a metal or polysilicon structure as the other electrode. The very high surface area of the porous silicon would be a major contributor to the high capacitance that could be achieved with such a capacitor.

The capacitance could be increased still further—even significantly increased—by placing an electrolyte 150 in physical contact with the porous structure. Electrolyte 150 (as well as other electrolytes described herein) is represented in the drawings using a random arrangement of circles. This representation is intended to convey the idea that the electrolyte is a substance (liquid or solid) containing free ions. The circles were chosen for convenience and are not intended to imply any limitation as to the electrolyte components or qualities, including any limitation with respect to the size, shape, or number of the ions. A typical, though not the only, type of electrolyte that may be used in accordance with embodiments of the invention is an ionic solution.

In an embodiment where electrolyte 150 is used, the electrical insulator separating electrically conductive structure 110 from electrically conductive structure 120 can be an electric double layer that is created by the presence of the electrolyte. This electric double layer, depicted schematically in FIG. 4, can complement or replace the dielectric material described above. As illustrated in FIG. 4, an electrical double layer (EDL) 330 has been formed within one of channels 111. EDL 330 is made up of two layers of ions, one of which is the electrical charge of the sidewalls of channel 111 (depicted as being positive in FIG. 4 but which could also be negative) and the other of which is formed by free ions in the electrolyte. EDL 330 electrically insulates the surface, thus providing the charge separation necessary for the capacitor to function. The large capacitance and hence energy storage potential of electrolytic ultracapacitors arises due to the small (approximately 1 nm) separation between electrolyte ions and the electrode.

It should be noted that when charge storage device 100 is discharged then the EDL dissipates. This means that under some circumstances—where the EDL replaces the dielectric layer, for example—electrically conductive structures 110 and 120 may for a time not be separated from each other by an electrical insulator—at least not the one embodied in the EDL. References herein to "a first electrically conductive structure and a second electrically conductive structure separated from each other by an electrical insulator" specifically include situations where, as described above, the electrical insulator is only present when the charge storage device is electrically charged.

In some embodiments electrolyte 150 is an organic electrolyte. As one example, the electrolyte can be a liquid or solid solution of organic materials such as tetraethylammonium tetrafluoroborate in acetonitrile. Other examples include solutions based on boric acid, sodium borate, or weak organic acids. Alternatively, (non-organic) water could be used as the electrolyte, but this may pose a safety risk in that water may boil and form a gas if the capacitor exceeds a certain temperature, possibly causing the capacitor to explode.

As mentioned above, high energy density is a desired characteristic for capacitors. However, a typical electrical double layer can withstand only a relatively low voltage—perhaps 2 or 3 volts—and this limits the energy density that can be achieved in practice. In order to increase the achievable energy density, embodiments of the invention incorporate materials having relatively higher breakdown voltages, thus increasing the overall breakdown voltage of the capacitor. As an example, materials that increase breakdown voltage can either be good electrical insulators or they can be very electrochemically inert (e.g., mercury). If these materials also have high dielectric constants (in which case they are referred to herein as "high-k materials"), the materials may have the additional beneficial effects of increasing capacitance and decreasing leakage current. Alternatively, separate layers or materials may be used for these purposes—i.e., one material to increase breakdown voltage along with a separate high-k material. Charge storage devices using high-breakdown-voltage materials in conjunction with porous structures and organic electrolytes have much greater energy density than do charge storage devices without such components.

A material is typically thought of as being a high-k material if its dielectric constant is greater than the dielectric constant of $SiO_2$, i.e., greater than 3.9. Since some embodiments of the invention may use $SiO_2$ as a dielectric coating, $SiO_2$ (as well as any other materials having dielectric constants of 3.9) are explicitly included within the scope of "high-k materials" as defined herein. At the same time, it should be noted that in other embodiments materials with significantly higher dielectric constants may also be used. To give several examples, the high-k material can be silicon nitride (SiN), silicon oxynitride ($SiO_xN_y$), hafnium oxide ($HfO_x$), zirconium oxide ($ZrO_x$), tantalum oxide ($TaO_x$), titanium oxide ($TiO_x$), or $BaSrTiO_3$ formed using ALD, CVD, thermal growth, or wet chemistry, all of which have dielectric constants roughly on the order of 20-50. More exotic materials, with still higher dielectric constants (the values of which are indicated in brackets next to each material below), may also be used. These include, for example, $(LaSr)_2NiO_4$ [$10^5$], $CaTiO_3$ [10,286], and related materials such as $CaCu_3Ti_4O_{12}$ [10,286] and $Bi_3Cu_3Ti_4O_{12}$ [1,871]. In some embodiments it may be desirable to select a high-k material having a dielectric constant greater than that of the electrolyte (often around 20 or so).

As suggested by the foregoing discussion of high-k materials, in some embodiments of the invention, charge storage device 100 further comprises a material having a dielectric constant of at least 3.9. As illustrated in FIG. 5, which is a cross-sectional view of one of channels 111 of charge storage device 100 according to an embodiment of the invention, charge storage device 100 comprises a high-k material 515 between electrolyte 150 and porous structure 110. (The EDL is not shown in FIG. 5 in order to avoid unnecessarily complicating the drawing.)

As mentioned above, embodiments of the invention increase the capacitance of a charge storage device by increasing its surface area and/or by decreasing the distance separating the conductive structures, and the preceding paragraphs have disclosed various techniques for achieving those results according to embodiments of the invention. According to additional embodiments, a capacitor's surface area may be still further increased by the presence of nanostructures within at least some of the channels of a charge storage device. (As used herein, the term "nanostructures" refers to structures having at least one dimension on the order of a nanometer up to a few tens of nanometers. Such nanostructures may be of regular or irregular shape. "Nanoparticles" are roughly spherical nanostructures. "Nanowires" are solid, roughly cylindrical nanostructures. "Nanotubes" are nanostructures that also tend to be roughly cylindrical but differ from nanowires in that they form hollow tubes. Carbon appears to be unique in its ability to form nanotubes; nanostructures made of other materials form nanowires.)

In accordance with the foregoing discussion, and as shown in FIG. 5, channel 111 contains nanostructures 535. As an example, these can be nanoparticles (perhaps in an isopropyl alcohol solution) or nanowires of any suitable material (e.g., silicon) or combination of materials (e.g., silicon germanium—with either a silicon core or a germanium core), carbon nanotubes, silicon-coated carbon nanotubes, or the like. Like channels 111 and 121, as well as other portions of the porous structure, some (or all) of nanostructures 535 can in at least one embodiment be coated, or partially coated, with an electrically conductive coating 540. As before, this coating should be a good electrical conductor (e.g., an appropriate metal, a silicide, or the like). At least some of the nanostructures may contain a dopant in order to further increase their electrical conductivity. Additionally, in some embodiments at least some of nanostructures 535 are coated with a material 545 that prevents an electrochemical reaction between nanostructures 535 and electrolyte 150. Material 545 increases the breakdown voltage of the charge storage device. As one example, material 545 may take the form of a monolayer of mercury or of another liquid metal like gallium or a gallium-indium-tin alloy on a surface of nanostructures 535 (or perhaps over electrically conductive coating 540, where such a coating is present).

Figure 6:
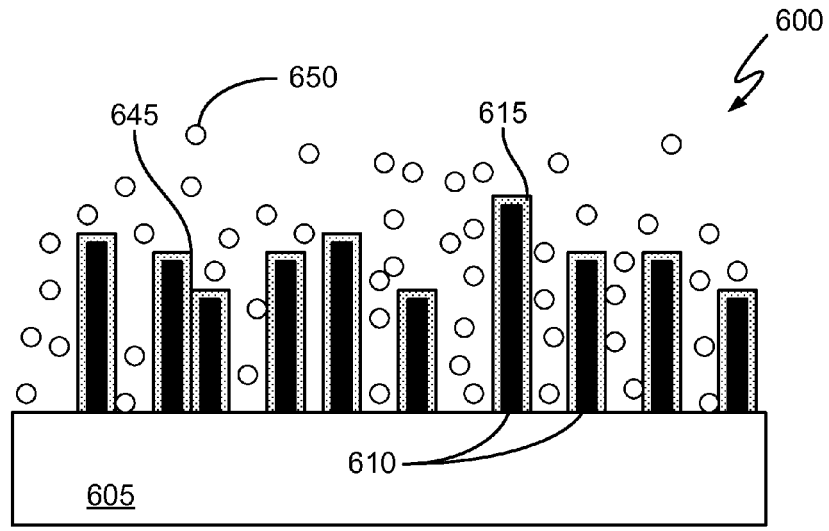
FIG. 6 is a cross-sectional view of a charge storage device according to another embodiment of the invention.

Turning next to FIG. 6, a charge storage device 600 according to another embodiment of the invention will be discussed. As illustrated in FIG. 6, charge storage device 600 comprises a plurality of nanostructures 610 on a substrate 605, and further comprises an electrolyte 650 in physical contact with at least some of nanostructures 610. (In the illustrated embodiment, nanostructures 610 are discrete nanostructures, i.e., they are, unlike the channels of a porous structure, for example, stand-alone structures that are not contained within another structure.) As an example, electrolyte 650 can be similar to electrolyte 150 that was first shown in FIG. 1. The presence of electrolyte 650 creates an EDL; i.e., charge storage device 600 is an EDLC. As an example, a first subset of plurality of nanostructures 610 forms a first electrode of charge storage device 600 and a second subset of plurality of nanostructures 610 forms a second electrode of charge storage device 600.

A charge storage device made up simply of the nanostructures and the electrolyte may represent a valuable, high-capacitance ultracapacitor according to an embodiment of the invention. As discussed above, however, it may often be desirable to increase the breakdown voltage and/or increase the capacitance and decrease the leakage current of the charge storage device and thus, in certain embodiments, a high-k material 615 (recall from above that this is defined herein as a material having a dielectric constant of at least 3.9) may be placed between electrolyte 650 and nanostructures 610. In the illustrated embodiment high-k material 615 takes the form of a coating at least partially covering the nanostructures. In some embodiments at least some of nanostructures 610 may additionally be coated with a material 645 that prevents an electrochemical reaction between nanostructures 610 and electrolyte 650. As an example, material 645 can be similar to material 545 that is shown in FIG. 5 and can in one embodiment, therefore, take the form of a monolayer of mercury (or one of the other substances mentioned) on a surface of the nanostructures.

In certain embodiments nanostructures 610 are nanowires formed from a suitable material (e.g., silicon, silicon-germanium (SiGe), III-V compounds (such as gallium arsenide (GaAs) or the like), among many others). In other embodiments nanostructures 610 comprise carbon nanotubes.

Figure 7:
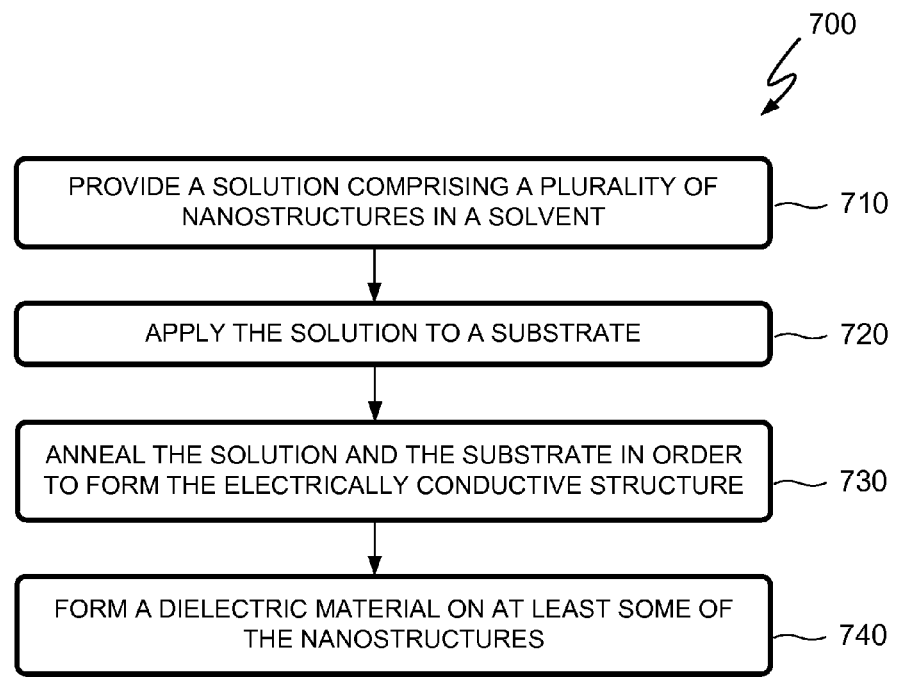
FIG. 7 is a flowchart illustrating a method of making an electrically conductive structure for a charge storage device according to an embodiment of the invention.

FIG. 7 is a flowchart illustrating a method 700 of making an electrically conductive structure for a charge storage device according to an embodiment of the invention.

A step 710 of method 700 is to provide a solution comprising a plurality of nanostructures in a solvent. In one embodiment the solvent is a photoresist material, especially a thick photoresist material (e.g., on the order of 500 µm thick). In other embodiments the solution can comprise a solvent other than photoresist. In a particular embodiment the solution comprises conductive nanoparticles in isopropyl alcohol. Using photoresist as the solvent may be advantageous because it is already so commonly used in microelectronics technology. Using photoresist may also simplify the patterning of the electrically conductive structures formed according to method 700, if such patterning is desired. Another possible advantage of using photoresist as the solvent arises when the nanostructures in the solvent are carbon nanotubes. In that case, the organic nature of the (carbon-based) photoresist leads to a high degree of compatibility with the organic nanotubes. The resulting carbon-carbon contacts in such a solution yield a high electrical conductivity.

A step 720 of method 700 is to apply the solution to a substrate. As an example, the substrate could be made of silicon (perhaps heavily doped silicon), silicon or another material having a conductive film (e.g., aluminum) deposited thereon, sheet glass coated with a thin film of metal, or, more generally, any suitable conductive material that is sufficiently rigid to act as a support. In one embodiment step 720 comprises electrospinning a photoresist material onto the substrate. Electrospinning involves applying an electric charge so that the fibers or other nanostructures can be directed into a desired arrangement. In one embodiment electrospinning the photoresist material creates a plurality of fibers at least some of which have a length of at least 500 µm. Regular spinning (without an electric charge) is an alternative to electrospinning Either spinning procedure permits a nice uniform application of the solution on the substrate. Alternatively, the solution could simply be poured onto the substrate without spinning, although thickness would likely be harder to control with this technique—the needed amount of solution would have to be very carefully measured out and accounted for to make sure none spilled off the edge of the wafer or substrate.

A step 730 of method 700 is to anneal the solution and the substrate in order to form the electrically conductive structure. Annealing drives out the solvents and leaves behind a structure that can be relatively thick. In one embodiment the anneal can comprise a pyrolysis reaction. If desired, some of the solvents can be driven out in a preliminary, lower-temperature event—perhaps by baking the substrate in an oven—that at least partially hardens the solution.

A step 740 of method 700 is to form a dielectric material on at least some of the nanostructures in order to improve the breakdown voltage. This could be accomplished, for example, by depositing aluminum or another suitable material on the nanostructures and then oxidizing the aluminum or other material.

Figure 8:
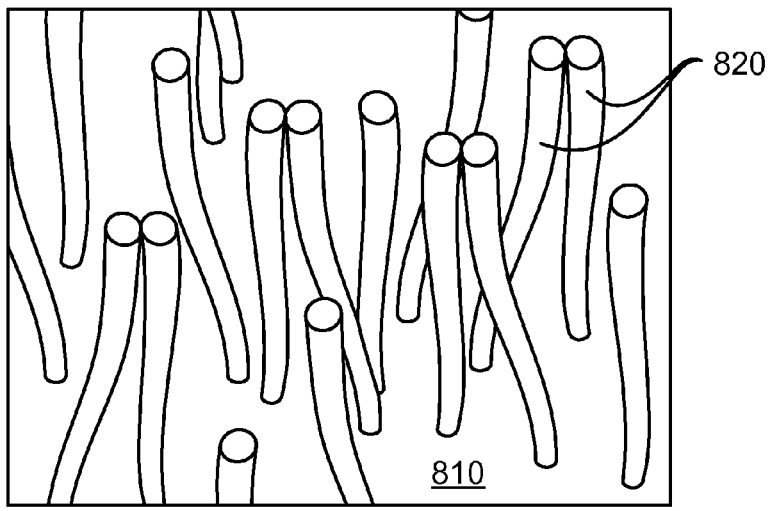
FIG. 8 is a perspective view of a relatively thick electrically conductive structure according to an embodiment of the invention.

The performance of method 700 results in an electrically conductive structure that may have a relatively substantial thickness. In order to achieve robust capacitance, a capacitive structure should have a generous thickness, a fact that existing capacitive structures based on nanostructures tend to ignore. Method 700, in at least some embodiments, thus makes use of a thick, organic photoresist (e.g., SR8) that can be spun onto a substrate at thicknesses of 500 µm or more. After pyrolysis, which drives out the solvent, one is left with nanostructures formed into a high-surface-area structure with a thickness on the order of the original thickness of the photoresist. An illustrative structure of the type described is shown in FIG. 8, where nanostructures 820 on a substrate 810 are visible. In this regard, it should be noted that FIG. 8, like some of the preceding figures, is an idealized representation of a structure that in reality would be much less orderly and much more like a jumbled haystack or a honeycomb or the like.

An alternative method for making a thick electrically conductive structure is by using nanoimprint lithography. This method involves creating a stencil that is then physically pushed up against a photoresist or the like, which forms the photoresist material into valleys and plateaus. This method likely will not result in thicknesses for the electrically conductive structure as great as those achievable with method 700, but will likely result, nevertheless, in fairly robust thicknesses on the order of perhaps 50-100 µm.

Figure 9:
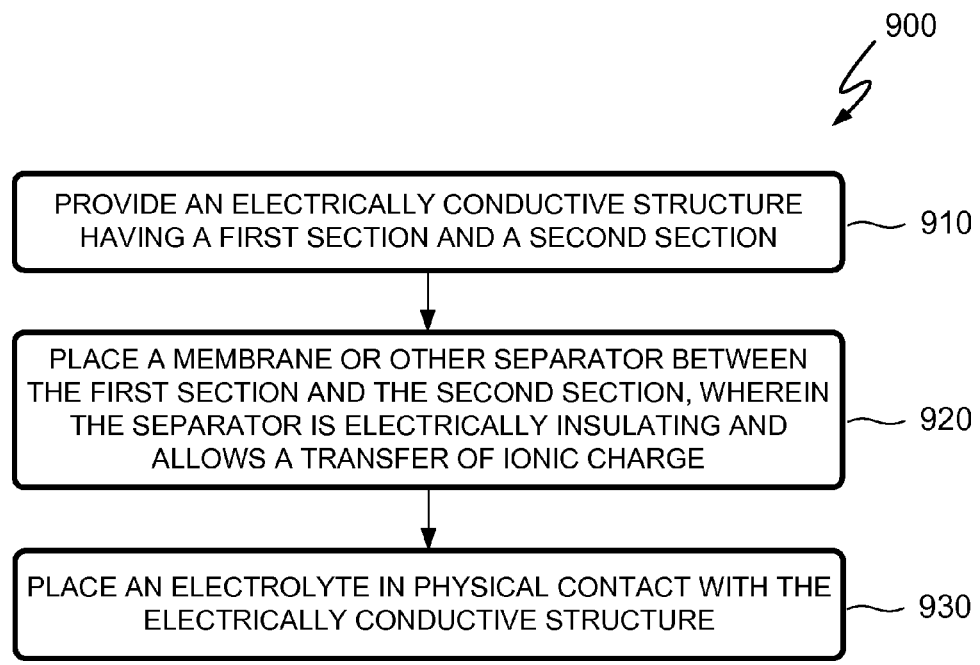
FIG. 9 is a flowchart illustrating a method of making a charge storage device according to an embodiment of the invention.

FIG. 9 is a flowchart illustrating a method 900 of making a charge storage device according to an embodiment of the invention.

A step 910 of method 900 is to provide an electrically conductive structure having a first section and a second section. In one embodiment step 910 comprises providing a solution comprising a plurality of nanostructures in a solvent, applying the solution to a substrate, and annealing the solution and the substrate in order to form the electrically conductive structure.

A step 920 of method 900 is to place a membrane or other separator between the first section and the second section, wherein the separator allows a transfer of ionic charge. In one embodiment step 920 or another step further comprises etching a trench between the first section and the second section and placing the separator in the trench.

A step 930 of method 900 is to place an electrolyte in physical contact with the electrically conductive structure.

Figure 10:
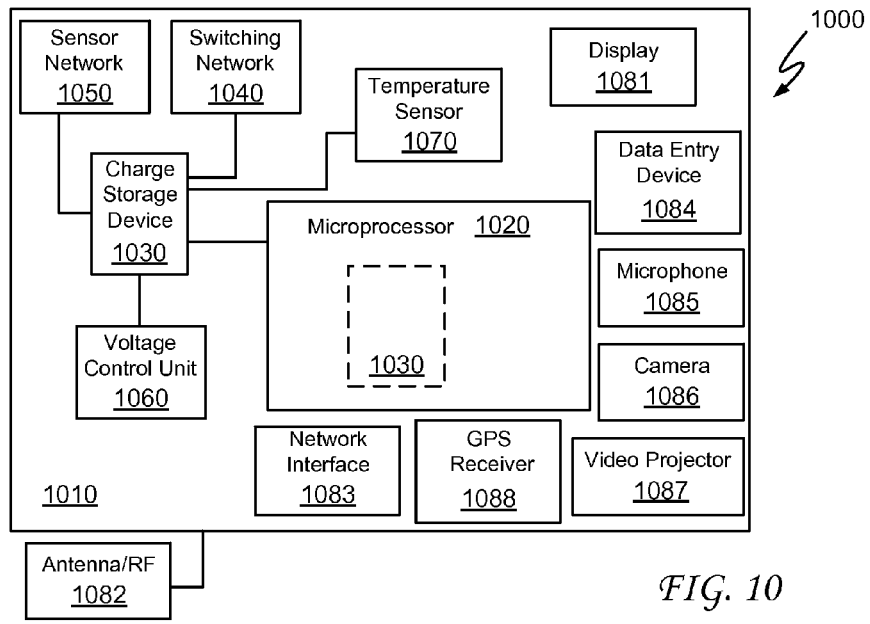
FIG. 10 is a block diagram representing a mobile electronic device according to an embodiment of the invention.

FIG. 10 is a block diagram representing a mobile electronic device 1000 according to an embodiment of the invention. As illustrated in FIG. 10, mobile electronic device 1000 comprises a substrate 1010 on which a microprocessor 1020 and a charge storage device 1030 associated with microprocessor 1020 are disposed. Charge storage device 1030 can either be located on substrate 1010 away from microprocessor 1020, as illustrated in solid lines, or it can be located on microprocessor 1020 itself, as illustrated in dashed lines. In one embodiment charge storage device 1030 comprises first and second electrically conductive structures separated from each other by an electrical insulator, where at least one of the first and second electrically conductive structures comprises a porous structure containing multiple channels. As an example, this embodiment can be similar to one or more of the embodiments shown in FIGS. 1-5 and described in the accompanying text. In another embodiment charge storage device 1030 comprises a plurality of nanostructures (e.g., discrete nanostructures) and an electrolyte in physical contact with at least some of the nanostructures. As an example, this embodiment can be similar to one or more of the embodiments shown in FIG. 6 and described in the accompanying text.

In at least some embodiments charge storage device 1030 is one of a plurality of charge storage devices (all of which are represented in FIG. 10 by block 1030) contained within mobile electronic device 1000. In one or more of those embodiments mobile electronic device 1000 further comprises a switching network 1040 associated with the charge storage devices. When a capacitor is being discharged it doesn't maintain a constant voltage but instead decays in an exponential manner (unlike a battery where the voltage stays relatively constant during discharge). Switching network 1040 comprises circuitry or some other mechanism that switches in and out various capacitors such that a relatively constant voltage is maintained. For example, the charge storage devices could initially be connected to each other in parallel and then, after a certain amount of voltage decay, a subset of the charge storage devices could be changed by the switching network so as to be connected in series such that their individual voltage contributions can boost the declining overall voltage. In one embodiment switching network 1040 could be implemented using existing silicon device technology as used in the art (transistors, silicon controlled rectifiers (SCRs), etc.), while in other embodiments it could be implemented using micro-electromechanical systems (MEMS) relays or switches (which, it may be noted, tend to have very low resistance).

In some embodiments mobile electronic device 1000 further comprises a sensor network 1050 associated with charge storage devices 1030. In at least some embodiments each one of the plurality of charge storage devices will have its own sensor that indicates certain behavioral parameters of the charge storage device. For example, the sensors may indicate existing voltage levels as well as the ongoing discharge response, both of which are parameters that may be used by the switching network—especially in cases where the dielectric material (or other electrical insulator) being used is not linear but rather has a dielectric constant that varies with the voltage. In those cases, it may be advantageous to include along with the sensor network a finite state machine such as a voltage control unit 1060 that knows what the behavior of the dielectric is and responds accordingly. A voltage control unit that knows how the dielectric behaves can compensate for any non-linearity. A temperature sensor 1070 associated with charge storage devices 1030 may also be included in order to sense temperature (or other safety-related parameters). In certain embodiments of the invention, mobile electronic device 1000 further comprises one or more of: a display 1081, antenna/RF elements 1082, a network interface 1083, a data entry device 1084 (e.g., a keypad or a touchscreen), a microphone 1085, a camera 1086, a video projector 1087, a global positioning system (GPS) receiver 1088, and the like.

Figure 11:
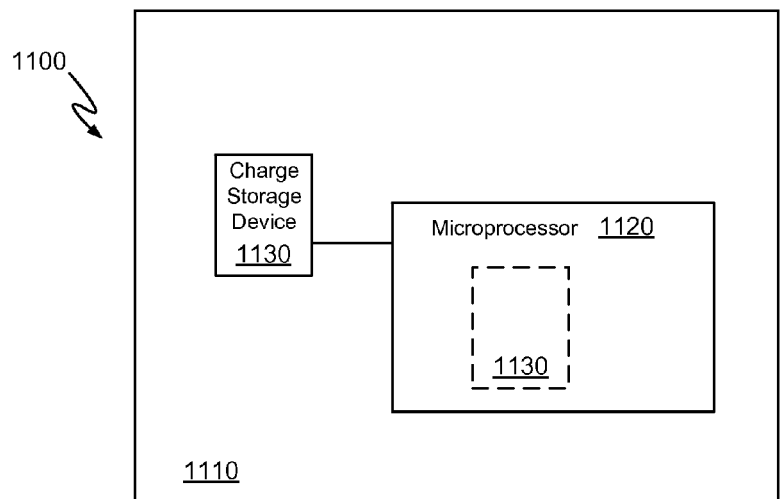
FIG. 11 is a block diagram representing a microelectronic device according to an embodiment of the invention.

FIG. 11 is a block diagram representing a microelectronic device 1100 according to an embodiment of the invention. As illustrated in FIG. 11, microelectronic device 1100 comprises a substrate 1110, a microprocessor 1120 over substrate 1110, and a charge storage device 1130 associated with microprocessor 1120. Charge storage device 1130 can either be located on substrate 1110 away from microprocessor 1120 (e.g., a die-side capacitor), as illustrated in solid lines, or it can be located on microprocessor 1120 itself (e.g., in a build-up layer above the microprocessor), as illustrated in dashed lines. In one embodiment charge storage device 1130 comprises first and second electrically conductive structures separated from each other by an electrical insulator, where at least one of the first and second electrically conductive structures comprises a porous structure containing multiple channels. As an example, this embodiment can be similar to one or more of the embodiments shown in FIGS. 1-5 and described in the accompanying text. In another embodiment charge storage device 1130 comprises a plurality of nanostructures (e.g., discrete nanostructures) and an electrolyte in physical contact with at least some of the nanostructures. As an example, this embodiment can be similar to one or more of the embodiments shown in FIG. 6 and described in the accompanying text.

The charge storage devices disclosed herein may in some embodiments be used as a decoupling capacitor within microelectronic device 1100—one that is smaller and that, for the reasons described elsewhere herein, offers much higher capacitance and much lower impedance than existing decoupling capacitors. As already mentioned, charge storage device 1130 can be part of a support integrated circuit (IC) or chip or it can be located on the microprocessor die itself. As an example, one might, according to embodiments of the invention, be able to form regions of porous silicon (or the like, as described above) on a microprocessor die and then create a high-surface-area embedded decoupling capacitor right on the substrate of the microprocessor die. Because of the porosity of the silicon, the embedded capacitor would have very high surface area. Other possible uses for the disclosed charge storage devices include use as a memory storage element (where problems with the z-direction size of embedded DRAM approaches may be solved by greatly increasing the farads per unit area) or as a component of voltage converters in voltage boost circuitry, perhaps for use with circuit blocks, individual microprocessor cores, or the like.

As an example, higher capacitance values could in this context be advantageous because parts of the circuit could then run nominally at a certain (relatively low) voltage but then in places where higher voltage is needed in order to increase speed (e.g., cache memory, input/output (I/O) applications) the voltage could be boosted to a higher value. An operational scheme of this sort would likely be preferred over one in which the higher voltage is used everywhere; i.e., in cases where only a small amount of circuitry requires a higher voltage it likely would be preferable to boost voltage from a lower baseline voltage for that small portion of the circuit rather than drop voltage from a higher baseline value for the majority of the circuitry. Future microprocessor generations may also make use of voltage converters of the type described here. Having more capacitance available to be deployed around a package or around a microprocessor die may help solve the existing issue of intolerably high inductance between transistors that transfer voltage around a circuit.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the charge storage devices and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A charge storage device comprising:
a first electrically conductive structure and a second electrically conductive structure separated from each other by an electrical insulator,
wherein:
   at least one of the first electrically conductive structure and the second electrically conductive structure comprises a porous structure containing multiple channels;
   the charge storage structure further comprises nanostructures located within at least some of the channels of the porous structure; and
   each one of the channels has an opening to a surface of the porous structure.

2. The charge storage device of claim 1 wherein:
a smallest dimension of each one of the channels is no less than 2 nanometers.

3. The charge storage device of claim 1 wherein:
the smallest dimension of each one of the channels is no greater than 1 micrometer.

4. The charge storage device of claim 1 wherein:
the porous structure is made of a material selected from the group comprising silicon, germanium, silicon-carbide, silicon-germanium, aluminum, tungsten, and copper.

5. The charge storage device of claim 1 further comprising:
an electrically conductive coating on at least a portion of the porous structure and in at least some of the channels.

6. The charge storage device of claim 1 wherein:
the porous structure contains a dopant.

7. The charge storage device of claim 1 wherein:
the electrical insulator comprises a dielectric material.

8. The charge storage device of claim 1 further comprising:
an electrolyte in physical contact with the porous structure,
wherein:
   the electrical insulator is a double layer created by the presence of the electrolyte.

9. The charge storage device of claim 8 wherein:
the electrolyte is an organic electrolyte.

10. The charge storage device of claim 8 further comprising:
a material having a dielectric constant of at least 3.9 between the electrolyte and the porous structure.

11. The charge storage device of claim 1 further comprising:
an electrically conductive coating on at least a portion of at least some of the nanostructures.

12. The charge storage device of claim 1 further comprising:
an electrolyte in physical contact with the porous structure.

13. The charge storage device of claim 12 wherein:
at least some of the nanostructures are coated with a material that prevents an electrochemical reaction between the nanostructures and the electrolyte.

14. The charge storage device of claim 12 wherein:
the material is one of mercury, gallium, and gallium-indium-tin; and
the material forms a monolayer on a surface of the nanostructures.

15. The charge storage device of claim 1 wherein:
at least some of the nanostructures contain a dopant.

16. A mobile electronic device comprising:
a microprocessor; and
a charge storage device associated with the microprocessor,
wherein:
   the charge storage device comprises a first electrically conductive structure and a second electrically conductive structure separated from each other by an electrical insulator; and
   at least one of the first electrically conductive structure and the second electrically conductive structure comprises a porous structure containing multiple channels, at least some of which contain nanostructures located therein.

17. The mobile electronic device of claim 16 wherein:
the charge storage device is one of a plurality of charge storage devices; and
the mobile electronic device further comprises a switching network associated with the charge storage devices.

18. The mobile electronic device of claim 17 further comprising:
a sensor network associated with the charge storage devices.

19. The mobile electronic device of claim 18 further comprising:
a voltage control unit associated with the sensor network and with the charge storage devices.

20. The mobile electronic device of claim 19 further comprising:
a temperature sensor associated with the charge storage devices.

21. A charge storage device comprising:
a first electrically conductive structure and a second electrically conductive structure separated from each other by an electrical insulator,
wherein:
   at least one of the first electrically conductive structure and the second electrically conductive structure comprises a porous structure containing multiple channels;
   the charge storage device further comprises an electrolyte in physical contact with the porous structure;
   the electrical insulator is a double layer created by the presence of the electrolyte;
   the charge storage device further comprises a material having a dielectric constant of at least 3.9 between the electrolyte and the porous structure; and
   each one of the channels has an opening to a surface of the porous structure.

* * * * *